United States Patent
Gu

(10) Patent No.: US 9,667,219 B2
(45) Date of Patent: May 30, 2017

(54) PHASE NOISE MEASUREMENT AND FILTERING CIRCUIT

(71) Applicant: The Regents of the University of California, Oakland, CA (US)

(72) Inventor: Qun Gu, Davis, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 15/136,786

(22) Filed: Apr. 22, 2016

(65) Prior Publication Data

US 2016/0315601 A1 Oct. 27, 2016

Related U.S. Application Data

(60) Provisional application No. 62/150,978, filed on Apr. 22, 2015.

(51) Int. Cl.
| | |
|---|---|
| *H03H 9/02* | (2006.01) |
| *H02M 3/07* | (2006.01) |
| *G01R 31/317* | (2006.01) |
| *H03K 5/003* | (2006.01) |
| *H03K 5/14* | (2014.01) |
| *H03K 5/00* | (2006.01) |
| *H03H 7/01* | (2006.01) |
| *H03H 7/075* | (2006.01) |

(52) U.S. Cl.
CPC ... *H03H 9/02535* (2013.01); *G01R 31/31709* (2013.01); *H02M 3/07* (2013.01); *H03H 7/0153* (2013.01); *H03H 7/075* (2013.01); *H03K 5/003* (2013.01); *H03K 5/14* (2013.01); *H03K 2005/00045* (2013.01)

(58) Field of Classification Search
CPC ............... G01R 31/31709; H03H 9/02535
See application file for complete search history.

(56) References Cited

U.S. PATENT DOCUMENTS

| | | | | |
|---|---|---|---|---|
| 7,034,591 | B2* | 4/2006 | Wang | H03L 7/0891 327/149 |
| 8,217,691 | B2* | 7/2012 | Pentakota | H03L 7/0802 327/148 |
| 8,289,056 | B2* | 10/2012 | Xu | H03D 13/004 327/156 |
| 8,310,290 | B2* | 11/2012 | Agarwal | H03L 7/0816 327/158 |
| 8,373,474 | B2* | 2/2013 | Hsiao | H03L 7/0816 327/149 |
| 8,390,268 | B2* | 3/2013 | Okayasu | G01R 29/26 324/76.54 |
| 2006/0045222 | A1* | 3/2006 | Kim | G11B 7/00456 375/354 |
| 2016/0241250 | A1* | 8/2016 | Cops | H03K 5/06 |

* cited by examiner

*Primary Examiner* — Jeffrey Zweizig
(74) *Attorney, Agent, or Firm* — Park, Vaughan, Fleming & Dowler LLP; Laxman Sahasrabuddhe

(57) ABSTRACT

Methods and apparatuses for measuring a phase noise level in an input signal are disclosed. An input signal can be delayed to generate a delayed version of the input signal. Next, a phase difference can be detected between the input signal and the delayed version of the input signal. A phase noise level in the input signal can then be determined based on the detected phase difference. The measured phase noise level can then be used to suppress phase noise in the input signal.

18 Claims, 3 Drawing Sheets

PHASE NOISE MEASUREMENT AND FILTERING CIRCUIT

RELATED APPLICATION

This application claims benefit of U.S. Provisional Application Ser. No. 62/150,978, by the same inventor, filed on 22 Apr. 2015, the contents of which are herein incorporated by reference in their entirety for all purposes.

This invention was made with Government support under Grant No. FA8650-14-1-7415, awarded by the US Air Force Electronic Systems Center. The Government has certain rights in this invention.

BACKGROUND

Technical Field

This disclosure relates to circuits. More specifically, this disclosure relates to a phase noise measurement and filtering circuit.

Related Art

Phase noise limits the performance of many systems, such as communication systems, imaging systems, sensing systems, and radar systems. To suppress phase noise, feedback and feed forward noise cancellation have been investigated. For example, see (1) A. Imani and H. Hashemi, "A Low-Noise FBAR-CMOS Frequency/Phase Discriminator for Phase Noise Measurement and Cancellation", in Proc. IEEE RFIC Symp, 2013 (hereinafter "Imani"), (2) S. Min, T. Copani, S. Kiaei, and B. Bakkaloglu, "A 90 nm CMOS 5 GHz Ring Oscillator PLL with Delay-Discriminator Based Active Phase Noise Cancellation", in Proc. IEEE RFIC Symp, 2012 (hereinafter "Min"), and (3) W. Khalil, B. Bakkaloglu, and S. Kiaei, "A Self-Calibrated On-Chip Phase-Noise-Measurement Circuit With −75 dBc Single-Tone Sensitivity at 100 kHz Offset", IEEE J. Solid-State Circuits, vol. 41, no. 12, pp. 2758-2765, 2007 (hereinafter "Khalil").

The capability of existing phase noise cancellation systems is limited by the phase noise measurement (PNM) circuit noise floor, which determines the best achievable phase noise performance. A delay line with large delay time and low phase noise is an important component of PNM. The approach in Imani adopts a high-Q FBAR filter as delay line to extract phase noise, which demonstrates a noise sensitivity of −162 dBc/Hz at 1 MHz offset. However, the operational bandwidth of this approach is limited by the high-Q filter, which is very small. The approaches in Min and Khalil utilize an active delay line chain to extract the phase noise, which is constrained by the high noise contribution from the active delay line itself.

Moreover, the PNM accuracy of existing approaches are vulnerable to environment noises, such as cross-talk and coupling noise. This drawback impedes the integration of the PNM into larger systems, where other circuits/sub-systems may produce a variety of coupling spurs and noises. Therefore, what are needed are PNM circuits without the above-described drawbacks.

SUMMARY

Some embodiments described herein include a PNM circuit that comprises a delay circuit, a phase detector (PD), and conversion circuitry to convert the output of the PD into a voltage signal that corresponds to a phase noise level in an input signal. Some embodiments can comprise (1) an input of the delay circuit can receive the input signal, and an output of the delay circuit can output a delayed version of the first input signal, (2) a first input of the PD can receive the input signal and a second input of the PD can receive the delayed version of the input signal that was outputted by the delay circuit, and (3) conversion circuitry to generate a second voltage signal based on the voltage signal outputted by the PD (note that the PD outputs a voltage signal that corresponds to a phase difference between the input signal and the delayed version of the input signal), wherein the second voltage signal corresponds to a phase noise level in the input signal.

In some embodiments, the conversion circuitry can comprise (1) a charge pump (CP) to charge or discharge a capacitor based on the voltage signal outputted by the PD, and (2) the capacitor, wherein a voltage at a terminal of the capacitor is outputted as the second voltage signal that corresponds to a phase noise level in the input signal. In some embodiments, the PNM circuit can comprise a direct current (DC) offset cancellation circuit to remove a DC offset within the circuits, including the PD and the CP.

In some embodiments, the delay circuit can comprise (1) a voltage controlled delay line (VCDL) and a fixed delay line in series, (2) a CP to charge or discharge a capacitor based on the voltage signal outputted by the PD, and (3) the capacitor, wherein a voltage at a terminal of the capacitor is provided as the control voltage to the VCDL.

In some embodiments, the VCDL is a passive VCDL, and the fixed delay line is a surface acoustic wave (SAW) filter. The SAW filter can be off-chip or can be realized on-chip by using a silicon-in-package (SiP) or a system-on-chip (SoC) solution. For example, a SAW filter that is included in an SiP is described in B. Wilkins, "Wafer Level Packaging of SAWs Enables Low Cost 2.5G and 3G Radio Modules", 3rd Intern. Symp. On Acoustic Wave Devices for Future Mobile Communication Systems, 3B-3, 2007. A SAW filter that is included in an SoC is described in L. Elbrecht, R. Aigner, C. Lin, H. Timme, "Integration of Bulk Acoustic Wave Filters: Concepts and Trends", in IEEE MTT-S Int. Microw. Symp. Dig., pp. 395-398, 2004.

In some embodiments, the PNM circuit can include a divider that reduces the frequency of the input signal, and the output of the divider can then be used for measuring the phase noise level in the input signal.

Some embodiments include a phase noise filter (PNF) circuit that filters phase noise from an input signal. Specifically, the PNF circuit can comprise (1) a PNM circuit that measures phase noise in the input signal, and (2) a voltage-controlled phase shifter (VCPS) to suppress phase noise in the input signal based on the voltage signal outputted by the PNM circuit.

Some embodiments include a device that comprises a PNM circuit and/or a PNF circuit. Examples of devices include, but are not limited to, communication devices, imaging devices, sensing devices, and radar devices. Specifically, a device can comprise (1) a PNM circuit that measures phase noise in an input signal, (2) a VCPS to output a clean input signal by suppressing phase noise in the input signal based on the voltage signal outputted by the PNM circuit, and (3) circuitry to process the clean input signal.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Figure 1:
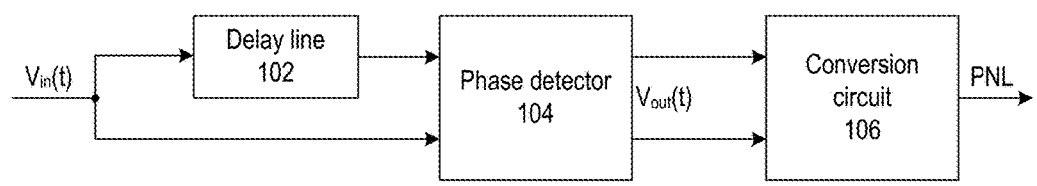
FIG. 1 illustrates a circuit comprising a delay line frequency discriminator in accordance with some embodiments described herein.

FIG. 1 illustrates a circuit comprising a delay line frequency discriminator in accordance with some embodiments described herein. Input signal $V_{in}(t)$ is provided as an input to delay line (DL) 102 and phase detector (PD) 104. DL 102 outputs a delayed version of input signal $V_{in}(t)$, and in doing so, transforms the absolute phase noise in $V_{in}(t)$ into relative timing jitter. The relative timing jitter is detected by PD 104, and is converted into voltage signal $V_{out}(t)$. Voltage signal $V_{out}(t)$ can then be converted by conversion circuit 106 into a voltage value (shown as "PNL" in FIG. 1) that corresponds to the phase noise level in input signal $V_{in}(t)$. Note that, if an original input signal was passed through a divider to reduce the frequency, and the output of the divider was the input signal $V_{in}(t)$, then the output of conversion circuit 106 will also correspond to the phase noise level in the original input signal.

The input signal with phase noise can be represented by a narrow-band FM signal without loss of generality:

$$V_{in}(t) = V_{amp} \cos\left(2\pi f_c t + \frac{\Delta f}{f_m} \cos(2\pi f_m t)\right) \quad (1)$$

where $V_{amp}$ is the input signal amplitude, $f_c$ is the carrier signal frequency, $f_m$ is the modulation frequency or the offset frequency of the target phase noise measurement, and $\Delta f/f_m$ is the index of the FM signal, which indicates the phase noise level.

The phase difference between the input signal and its delayed one represents the phase noise level which can be expressed as $$\Delta \phi = \frac{\Delta f}{f_m} |\cos(2\pi f_m t) - \cos(2\pi f_m (t-\tau))| \quad (2)$$

where $\tau$ is the delay time of the delay line.

By converting the phase noise modulated on the carrier frequency to the baseband, the baseband signal processor, such as amplifier, can magnify the extracted phase noise as $$V_{out}(t) \approx 2\pi \tau \cdot \Delta f \sin(2\pi f_m (t-\tau/2)) \cdot K_{PD} \cdot G \quad (3)$$

where $K_{PD}$ is the phase detector gain and G is the amplifier gain. The output voltage is proportional to sideband amplitude $\Delta f$, which represents the phase noise level.

There are a few design concerns and challenges in PNM design:

1) One important requirement is to tolerate coupling noise and differentiate phase noise from amplitude noise. To achieve this, PD/CP based phase noise extraction scheme can be adopted.

2) With PD/CP based PNM, the phase of PD inputs should be in-phase. To achieve this, an embedded delay locked loop (DLL) can be designed to guarantee that the delay time is an integer multiple of signal period, i.e., $\tau=nT$.

3) Due to the very small phase noise level, any circuit mismatch can desensitize the circuit. To overcome this issue, an on-chip DC offset cancellation circuit can be used.

Figure 2:
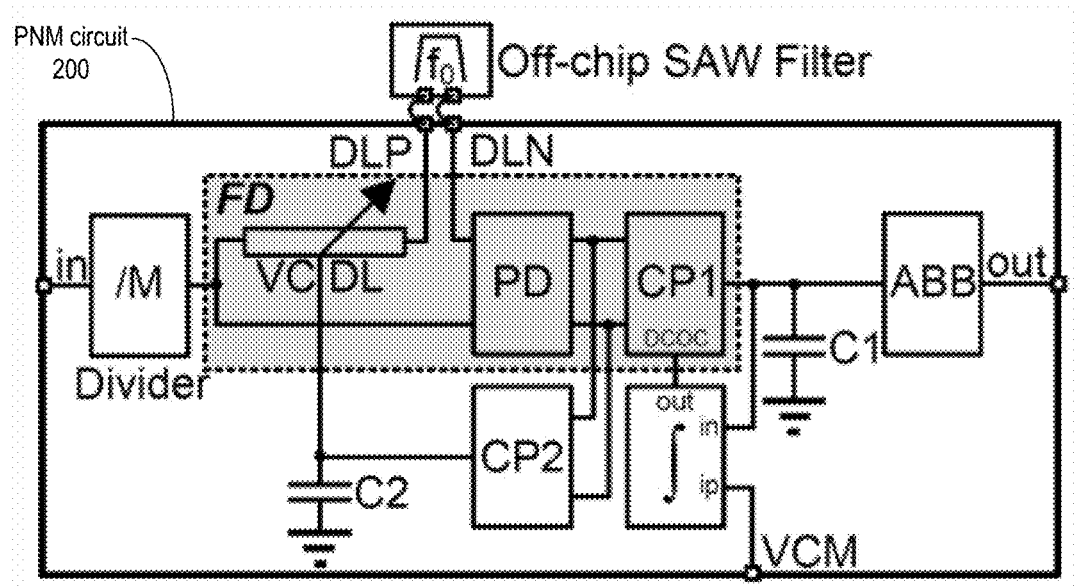
FIG. 2 illustrates a PNM circuit in accordance with some embodiments described herein.

FIG. 2 illustrates a PNM circuit in accordance with some embodiments described herein. PNM circuit 200 comprises divider (shown as "/M" in FIG. 2), on-chip passive voltage controlled delay line (shown as "VCDL" in FIG. 2), a fixed delay line (which in this embodiment is an off-chip SAW filter, which can alternatively be realized on-chip to reduce the form factor), PD, charge pumps (CP1 and CP2), and analog baseband (ABB), which includes a variable gain amplifier (VGA) and a low pass filter (LPF). The label "FD" refers to the frequency discriminator that comprises the delay line, phase detector, and charge pump. Specifically, the divider "/M" reduces the frequency of input signal "in," and the output from divider "/M" is provided as an input to the VCDL and the PD. The VCDL and the PD convert the phase noise in the input signal "in" into a voltage (this is explained above in reference to FIG. 1). The output of the PD is provided as an input to charge pump CP1 which charges or discharges capacitor C1 depending on the output from the PD. Note that the voltage at a terminal of capacitor C1 corresponds to the phase noise in the input signal "in." The voltage across capacitor C1 is provided as an input to the ABB, and the output of the ABB is provided as the output of the PNM circuit 200. Note that input signal $V_{in}(t)$ in FIG. 1 corresponds to the output of the divider "/M" in FIG. 2, delay line 102 in FIG. 1 corresponds to VCDL in FIG. 2, phase detector 104 in FIG. 1 corresponds to PD in FIG. 2, and conversion circuit 106 corresponds to the combination of charge pump CP1, capacitance C1, and ABB.

One of the key performances of PNM is the phase noise sensitivity, which is determined by the circuit noise floor, and can be calculated as:

$$PN_{sensitivity} = 20 \log_{10}\left(\frac{V_{n,out}(f_m)}{TF(f_m)}\right) \quad (4)$$

where $V_{n,out}(f_m)$ is the output noise and TF $(f_m)$ is the transfer function of PNM, which can be represented as $$TF = (2\pi \tau \cdot K_{PDCP} \cdot G) \cdot f_m \quad (5)$$

where $K_{PDCP}$ is PD/CP gain, and G is VGA gain. Equations (4) and (5) show that large delay time delay line with small phase noise is preferable for better phase noise sensitivity. In addition, large $K_{PDCP}$ also improves phase noise sensitivity.

There are two types of phase noise extraction methods: mixer based and PD/CP based methods. Some embodiments described herein use a PD/CP based phase noise extraction scheme due to two key advantages: in-phase relationship requirement and insensitivity to amplitude noise.

The mixer based FD requires the two input signals to be quadrature phase relationship. For example, Khalil adopts a calibration loop to ensure the quadrature. The loop includes a comparator, a state machine and a programmable LDO. But the implementation is sensitive to environment and coupling noises due to their different transient states.

In contrast, the PD/CP based FD requires the input signal to be in-phase, which leverages the same transient state of the two inputs and suppresses the coupling noise by converting them into common mode noises. As to the phase alignment, a DLL based approach ensures the in-phase relationship, as shown in FIG. 2, which is a more effective implementation scheme. Specifically, in FIG. 2, charge pump CP2 and capacitor C2 generate a voltage signal that corresponds to the phase difference between the input signal and the delayed version of the input signal that is outputted by the combination of the VCDL and the off-chip SAW filter. This voltage signal can be provided as the control voltage to VCDL. This feedback loop ensures that the delay of VCDL is such that the two inputs to the PD are in-phase.

The mixer based phase extraction scheme is responsive to both amplitude and phase information of the input signals, therefore it is sensitive to environment variations. However, PD mainly extracts the phase information of the inputs. Therefore, it is more reliable in integrated circuits and systems.

As explained above, the DLL comprises the VCDL, a fixed delay line (e.g., SAW filter), PD, CP2, and C2. Specifically, to ensure the in-phase relationship, DLL controls the varactor of the on-chip VCDL to adjust the input phase relationship. DLL is a one-pole system to ensure the stability.

Figure 3:
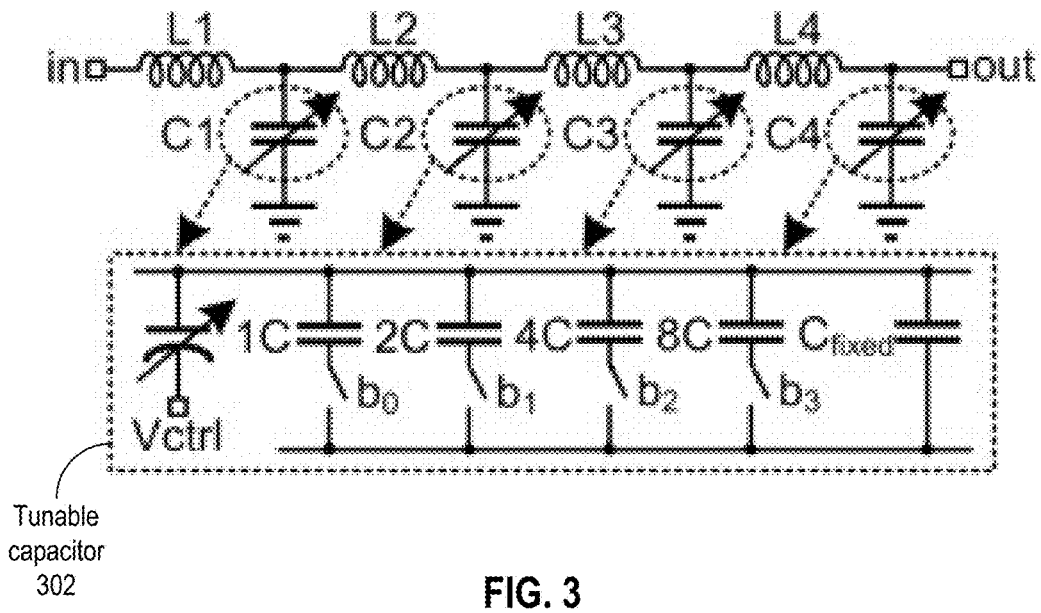
FIG. 3 illustrates a VCDL that includes four cascaded stages LC type transmission lines in accordance with some embodiments described herein.

FIG. 3 illustrates a VCDL that includes four cascaded stages of LC type transmission lines in accordance with some embodiments described herein. In general, the VCDL can comprise greater or fewer than four stages. In FIG. 3, the VCDL has four tunable capacitors (C1 through C4) and fixed inductors (L1 through L4). As shown in tunable capacitor 302, each tunable capacitor includes one fixed capacitor ($C_{fixed}$), a 4-bit (bits $b_0$ through $b_3$) switchable cap array for discrete delay adjustment and a varactor for continuous delay adjustment (the capacitance of the varactor being controlled by control voltage $V_{ctrl}$). The phase noise of the combination of VCDL and SAW filter is superior due to their passive nature. For example, in one implementation, the phase noises were −182/−185 dBc/Hz at 100 kHz/1 MHz offset, respectively. In one implementation, the SAW filter had 24 MHz bandwidth at 1.25 GHz center frequency. The in-band group delay was about 20 ns.

To remove the DC offset due to mismatches of PD/CP, a DC offset cancellation circuit can be used. In FIG. 2, the DC offset circuit is labeled "DCOC" and is shown as part of charge pump CP1. The offset voltage is provided by the integrator in FIG. 2 which is labeled by the integral sign "∫." The integrator receives two inputs: (1) the output voltage of charge pump CP1, and (2) the common mode voltage VCM. The integrator outputs the DC offset cancellation voltage that is then used by charge pump CP1 to remove the DC offset between the PD and charge pump CP1.

Figure 4:
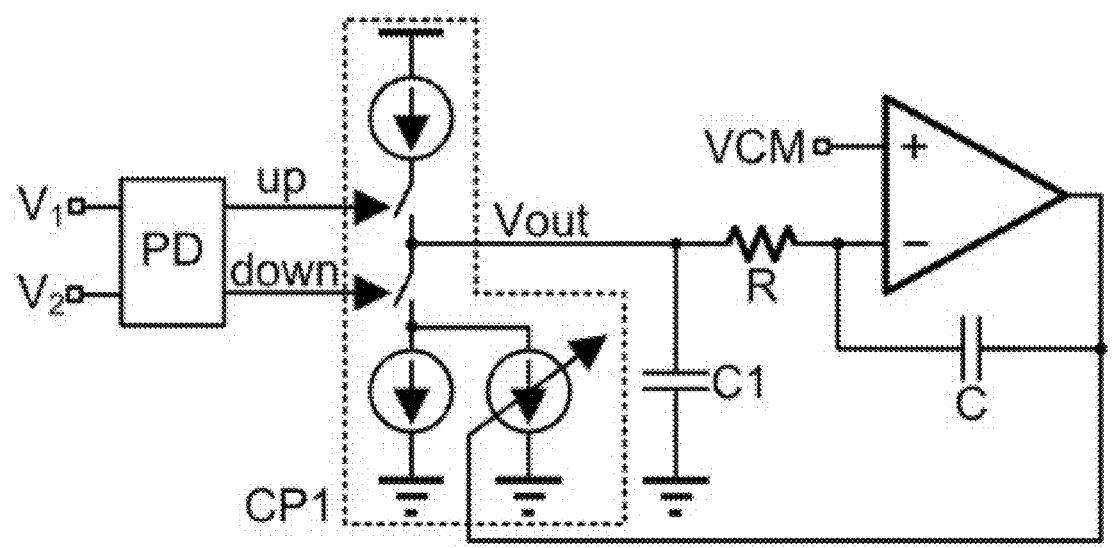
FIG. 4 illustrates a DC offset cancellation circuit that can be used to remove the DC offset due to circuit mismatches in accordance with some embodiments described herein.

FIG. 4 illustrates a DC offset cancellation circuit that can be used to remove the DC offset due to circuit mismatches in accordance with some embodiments described herein. The output voltage of CP1 is extracted by the integrator and compares with the VCM. The output of the integrator changes the discharging current until the CP1 output common mode voltage equals to VCM to cancel the DC offset introduced by mismatches. This DC offset cancellation circuit can compensate DC offset caused by CP charging and discharging current mismatch, PD input phase mismatch, up and down pulse rising and falling time differences, etc. Voltage signals $V_1$ and $V_2$ are the inputs to the PD, and the charge pump CP1 either charges or discharges capacitance C1 based on the "up" or "down" output from the PD. Note that the resistor "R" and capacitor "C" of the integrator must be large to prevent the desired signal from affecting the discharging current. For example, in one implementation, the following values were used: R=12.4 MOhm and C=54 pF (which corresponds to a 237.7 Hz corner frequency).

In one implementation, a 10 GHz PNM circuit was fabricated in a 65 nm CMOS technology that occupied 1.5 mm×1.3 mm area including PADs. The fabricated chip was mounted to a double-sided FR4 PCB for test. The core circuit consumed 15.2 mW power. For testing purposes, a single-tone (ST) FM signal was used to evaluate the linearity and sensitivity of the PNM. An analog signal generator was used to generate a 10 GHz FM signal as the input signal to the PNM circuit. The output was monitored by a signal analyzer with very low displayed average noise level (DANL) to improve test accuracy. Test results measured the ST output amplitude versus sideband amplitude with different modulation frequency. Good linearity was verified (less than 1 dB error). The ST sensitivity was measured using an FM signal. It was found that when the sideband amplitude of the FM signal was reduced, the output eventually deviated away from the linear response due to the circuit's own noise contribution. The 1 dB deviation point corresponded to the phase noise measurement ST sensitivity. Measurement results showed that the system's ST sensitivity was −61/−81 dBc at 100 kHz/1 MHz offset, respectively. The equivalent phase noise sensitivity was calculated from the ST results by averaging a window of three adjacent offset frequencies over the corresponding bandwidth. The equivalent phase noise sensitivity is −110.35/−138.60 dBc/Hz, which is better than the requirements of most applications.

It was demonstrated that one implementation of the PNM can support wide working bandwidth. For this demonstration, the implementation was limited by the SAW filter's 24 MHz bandwidth. The input frequency range was 8 times the SAW filter's bandwidth due to the divide-by-8 circuit in the front. The actual measured frequency range for the demonstration was 9.896-10.096 GHz.

Comparison with other state-of-the-art solutions demonstrates that embodiments described herein are superior to those other approaches. Specifically, embodiments described herein are insensitive to amplitude and environment noise to facilitate integration. The phase noise sensitivity can be improved by more than 10 dB when the CP current is increased from 0.64 mA to a few mA. The working bandwidth can also be boosted by using wideband SAW filter or an array of filters.

Embodiments described herein feature a PNM circuit that includes a passive delay line frequency discriminator and PD/CP phase extractor. These embodiments have wide bandwidth, great sensitivity, and immunity to amplitude and coupling noises, thus is suitable to be integrated. Specifically, some implementations achieved −61/−81 dBc ST sensitivity at 100 kHz/1 MHz offset, which is equivalent to phase noise sensitivity of −110.35/−138.60 dBc/Hz. The phase noise sensitivity can be further improved by more than 10 dB when CP current is increased. Therefore, embodiments described herein provide a high potential solution for ultra-sensitive high-reliability on-chip phase noise measurement.

The phase noise measured by the PNM circuit can be used in many applications. One application is to filter phase noise in a signal generated by a local oscillator (LO). For example, a local oscillator can be used in communication devices, imaging devices, sensing devices, radar devices, etc. LO phase noise limits the performance of these and other electronic systems. Reducing the phase noise in the signal generated by the LO in each of these devices can improve the performance of the devices.

Figure 5:
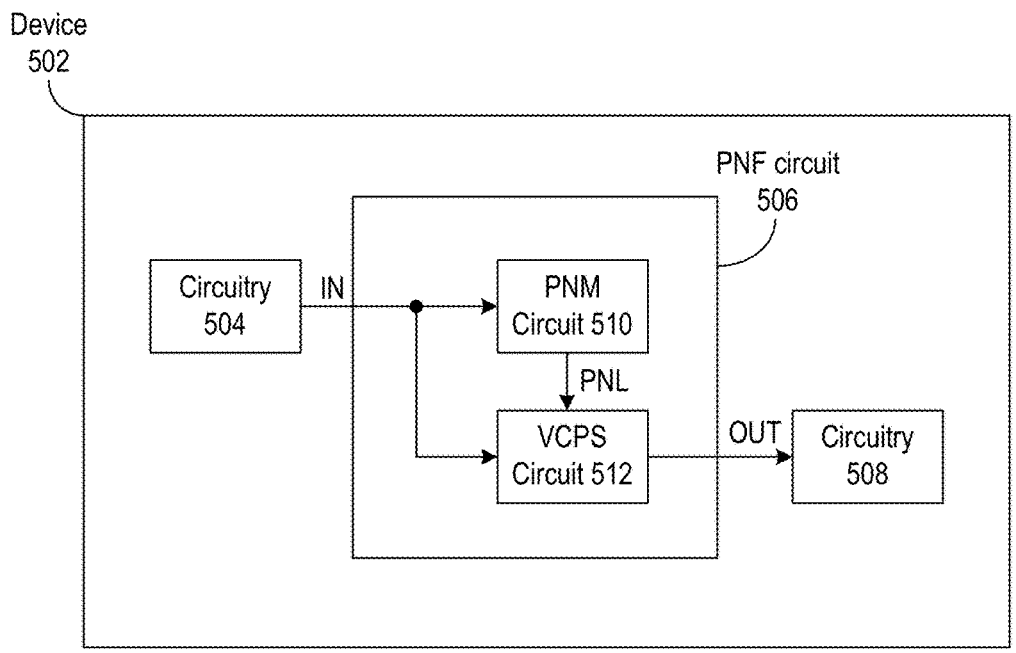
FIG. 5 illustrates a device comprising a PNF circuit that uses a PNM circuit in accordance with some embodiments described herein.

FIG. 5 illustrates a device comprising a PNF circuit that uses a PNM circuit in accordance with some embodiments described herein. Device 502 can comprise circuitry 504 that generates a signal that contains phase noise. This signal can be provided as an input signal (shown as "IN" in FIG. 5) to PNF circuit 506, and PNF circuit 506 can substantially remove the phase noise from the input signal. The clean output signal (shown as "OUT" in FIG. 5) outputted by PNF circuit 506 can then be provided as an input to circuitry 508 for further processing. PNF circuit 506 can include PNM circuit 510 and VCPS circuit 512. VCPS circuit 512 can take two inputs: (1) an input signal whose phase is to be changed and (2) a control voltage that determines the amount of phase change that is applied to the input signal at any given time instance. VCPS circuit 512 can change the phase of the input signal by changing the timing of a low-to-high or a high-to-low transition (by causing the transition to occur earlier or later) in the input signal. The amount of phase adjustment that is applied to the input signal can be controlled by providing the appropriate control voltage to VCPS circuit 512. VCPS circuit 512 can then output the phase-adjusted input signal. In FIG. 5, the input signal "IN" can be provided as an input to PNM circuit 510 and also as an input to VCPS circuit 512. The phase noise level measured by PNM circuit 510 (shown as "PNL" in FIG. 5) can be provided as an input to VCPS circuit 512, which can use the measured phase noise level to apply a corresponding amount of phase noise suppression to the input signal, thereby outputting the clean output signal. For example, the phase noise level PNL can correspond to a voltage level outputted by PNM circuit 510, which is used as a control voltage by VCPS circuit 512.

Figure 6:
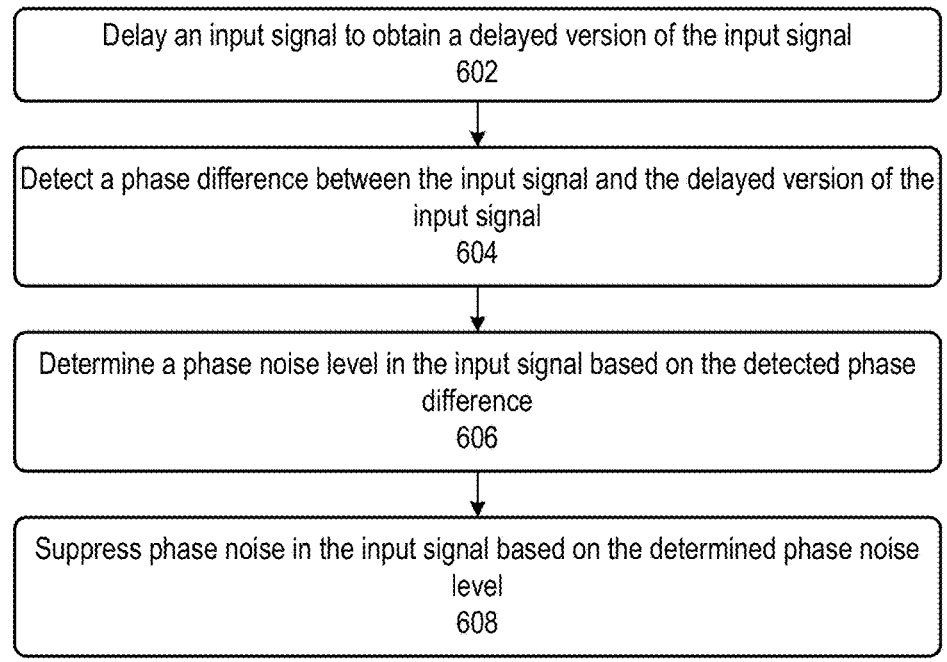
FIG. 6 illustrates a process for measuring phase noise level in an input signal and removing the phase noise from the input signal in accordance with some embodiments described herein.

FIG. 6 illustrates a process for measuring phase noise level in an input signal and removing the phase noise from the input signal in accordance with some embodiments described herein. The process can begin by delaying an input signal to obtain a delayed version of the input signal (operation 602). Next, the process can detect a phase difference between the input signal and the delayed version of the input signal (operation 604). The process can then determine a phase noise level in the input signal based on the detected phase difference (operation 606). Next, the process can suppress phase noise in the input signal based on the determined phase noise level (operation 608).

The foregoing description has been presented to enable any person skilled in the art to make and use the embodiments. The described embodiments are not intended to be exhaustive or to limit the present invention. Various modifications to the disclosed embodiments will be readily apparent to those skilled in the art, and the general principles defined herein are applicable to other embodiments and applications without departing from the spirit and scope of the present disclosure. Thus, the present invention is to be accorded the widest scope consistent with the principles and features disclosed herein. The scope of the present invention is defined by the appended claims.

What is claimed is:

1. A phase noise measurement (PNM) circuit, comprising:
   a delay circuit, wherein an input of the delay circuit receives a first input signal, and wherein an output of the delay circuit outputs a delayed version of the first input signal;
   a phase detector (PD), wherein a first input of the PD receives the first input signal, wherein a second input of the PD receives the delayed version of the first input signal, and wherein the PD outputs a first voltage signal that corresponds to a phase difference between the first input signal and the delayed version of the first input signal;
   circuitry to generate a second voltage signal based on the first voltage signal, wherein the second voltage signal corresponds to a phase noise level in the first input signal;
   wherein the circuitry to generate the second voltage signal comprises: (1) a first charge pump (CP) to charge or discharge a first capacitor based on the first voltage signal outputted by the PD, and (2) the first capacitor, wherein a voltage at a terminal of the first capacitor is outputted as the second voltage signal; and
   wherein the delay circuit comprises: (1) a voltage controlled delay line (VCDL) and a fixed delay line electrically coupled in series, (2) a second CP to charge or discharge a second capacitor based on the first voltage signal outputted by the PD, and (3) the second capacitor, wherein a voltage at a terminal of the second capacitor is provided as a control voltage to the VCDL.

2. The PNM circuit of claim 1, further comprising a direct current (DC) offset cancellation circuit to remove at least one DC offset in the PNM circuit.

3. The PNM circuit of claim 1, wherein the VCDL is a passive VCDL.

4. The PNM circuit of claim 1, wherein the fixed delay line is a surface acoustic wave (SAW) filter.

5. The PNM circuit of claim 1, further comprising a divider to receive a second input signal, and to output the first input signal.

6. A phase noise filter (PNF) circuit, comprising:
   a phase noise measurement (PNM) circuit, comprising:
      a divider to receive a first input signal, and to output a second input signal;
      a delay circuit, wherein an input of the delay circuit receives the second input signal, and wherein an output of the delay circuit outputs a delayed version of the second input signal;
      a phase detector (PD), wherein a first input of the PD receives the second input signal, wherein a second input of the PD receives the delayed version of the second input signal, and wherein the PD outputs a first voltage signal that corresponds to a phase difference between the second input signal and the delayed version of the second input signal; and
      circuitry to generate a second voltage signal based on the first voltage signal, wherein the second voltage signal corresponds to a phase noise level in the first input signal; and
   a voltage-controlled phase shifter (VCPS) to suppress phase noise in the first input signal based on the second voltage signal.

7. The PNF circuit of claim 6, wherein the circuitry to generate the second voltage signal comprises:

a first charge pump (CP) to charge or discharge a first capacitor based on the first voltage signal outputted by the PD; and the first capacitor, wherein a voltage at a terminal of the first capacitor is outputted as the second voltage signal.

8. The PNF circuit of claim 7, further comprising a direct current (DC) offset cancellation circuit to remove at least one DC offset in the PNF circuit.

9. The PNF circuit of claim 7, wherein the delay circuit comprises:
   a voltage controlled delay line (VCDL) and a fixed delay line electrically coupled in series;
   a second charge pump (CP) to charge or discharge a second capacitor based on the first voltage signal outputted by the PD; and
   the second capacitor, wherein a voltage at a terminal of the second capacitor is provided as a control voltage to the VCDL.

10. The PNF circuit of claim 9, wherein the VCDL is a passive VCDL.

11. The PNF circuit of claim 9, wherein the fixed delay line is a surface acoustic wave (SAW) filter.

12. A device, comprising:
   a phase noise measurement (PNM) circuit, comprising:
      a divider to receive a first input signal, and to output a second input signal;
      a delay circuit, wherein an input of the delay circuit receives the second input signal, and wherein an output of the delay circuit outputs a delayed version of the second input signal;
      a phase detector (PD), wherein a first input of the PD receives the second input signal, wherein a second input of the PD receives the delayed version of the second input signal, and wherein the PD outputs a first voltage signal that corresponds to a phase difference between the second input signal and the delayed version of the second input signal; and
      circuitry to generate a second voltage signal based on the first voltage signal, wherein the second voltage signal corresponds to a phase noise level in the first input signal;
   a voltage-controlled phase shifter (VCPS) to output a clean input signal by suppressing phase noise in the first input signal based on the second voltage signal; and
   circuitry to process the clean input signal.

13. The device of claim 12, wherein the circuitry to generate the second voltage signal comprises:
   a first charge pump (CP) to charge or discharge a first capacitor based on the first voltage signal outputted by the PD; and
   the first capacitor, wherein a voltage at a terminal of the first capacitor is outputted as the second voltage signal.

14. The device of claim 13, further comprising a direct current (DC) offset cancellation circuit to remove at least one DC offset in the device.

15. The device of claim 13, wherein the delay circuit comprises:
   a voltage controlled delay line (VCDL) and a fixed delay line electrically coupled in series;
   a second charge pump (CP) to charge or discharge a second capacitor based on the first voltage signal outputted by the PD; and
   the second capacitor, wherein a voltage at a terminal of the second capacitor is provided as a control voltage to the VCDL.

16. The device of claim 15, wherein the VCDL is a passive VCDL.

17. The device of claim 12, wherein the fixed delay line is a surface acoustic wave (SAW) filter.

18. The device of claim 12, wherein the device is one of: a communication device, an imaging device, a sensing device, or a radar device.

* * * * *